United States Patent
Liang

(10) Patent No.: US 7,618,309 B2
(45) Date of Patent: Nov. 17, 2009

(54) FAN DEVICE FOR A COMPUTER HOST

(75) Inventor: Chien-Fa Liang, Chung-Ho (TW)

(73) Assignee: Super Micro Computers, Inc., San Jose, CA (US)

( * ) Notice: Subject to any disclaimer, the term of this patent is extended or adjusted under 35 U.S.C. 154(b) by 653 days.

(21) Appl. No.: 11/320,841

(22) Filed: Dec. 30, 2005

(65) Prior Publication Data

US 2007/0153477 A1   Jul. 5, 2007

(51) Int. Cl.
  *H05K 5/00* (2006.01)
  *H05K 7/20* (2006.01)
(52) U.S. Cl. ..................... 454/184; 361/695
(58) Field of Classification Search ............... 454/184; 361/695
  See application file for complete search history.

(56) References Cited

U.S. PATENT DOCUMENTS 5,969,941 A * 10/1999 Cho ........................... 361/687
6,540,461 B1 * 4/2003 Hawang ....................... 411/48
2006/0120040 A1 * 6/2006 Chen ........................... 361/695

* cited by examiner

*Primary Examiner*—Steve McAllister
*Assistant Examiner*—Helena Kosanovic
(74) *Attorney, Agent, or Firm*—Lowe Hauptman Ham & Berner, LLP

(57) ABSTRACT

A fan device for a computer host includes a rectangular container having an emplacement sink, a plurality of fans each of whose front and rear surfaces are provided with a plurality of latch holes, a plurality of positioning outer jackets made by a flexible material, and a plurality of positioning inner jackets made by a hard material and inserted into positioning holes of the positioning outer jackets, wherein an exterior edge of positioning outer jacket can be latched and positioned on an inner sink wall of the emplacement sink, so as to latch and fix the fans onto a casing of computer host without using screws, and to achieve the effects of absorbing vibration and reducing a noise at the same time.

1 Claim, 6 Drawing Sheets

FAN DEVICE FOR A COMPUTER HOST

BACKGROUND OF THE INVENTION a) Field of the Invention

The present invention relates to a fan device for a computer host, and more particularly to a fan structure which can fixed on a casing of host without using screws and can effectively reduce a vibration force.

b) Description of the Prior Art

A fan in an ordinary computer host is used for dissipating heat resulting from an electronic part (such as a PC board) or an element (such as an IC), however, the conventional technology is provided with the following drawbacks under a long term of usage:

(1) Each fan should be fixed on the casing with screws. Therefore, if a fan is damaged, the screws should be disassembled to repair or replace the fan, which is very troublesome in assembling and disassembling.

(2) As there is no effective device for reducing a vibration, a large noise will be generated when the fan is rotating, and the fixed screws will be easily loosened.

SUMMARY OF THE INVENTION

The primary object of present invention is to provide a fan device for a computer host which can be latched and fixed on a casing of computer host without using screws.

Another object of the present invention is to provide a fan device for a computer hose which is provided with a function of effectively reducing a noise when the fan is rotating.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
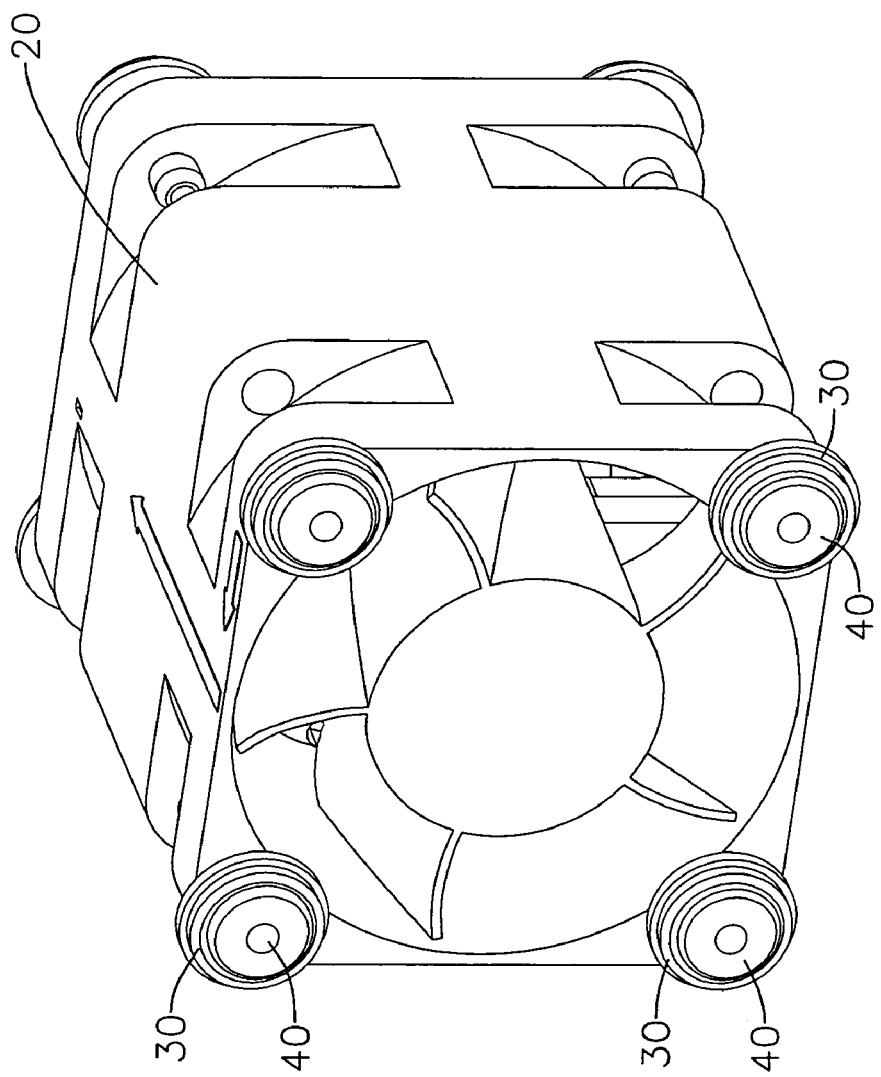
FIG. 1 shows a perspective view of parts of the present invention.
Figure 2:
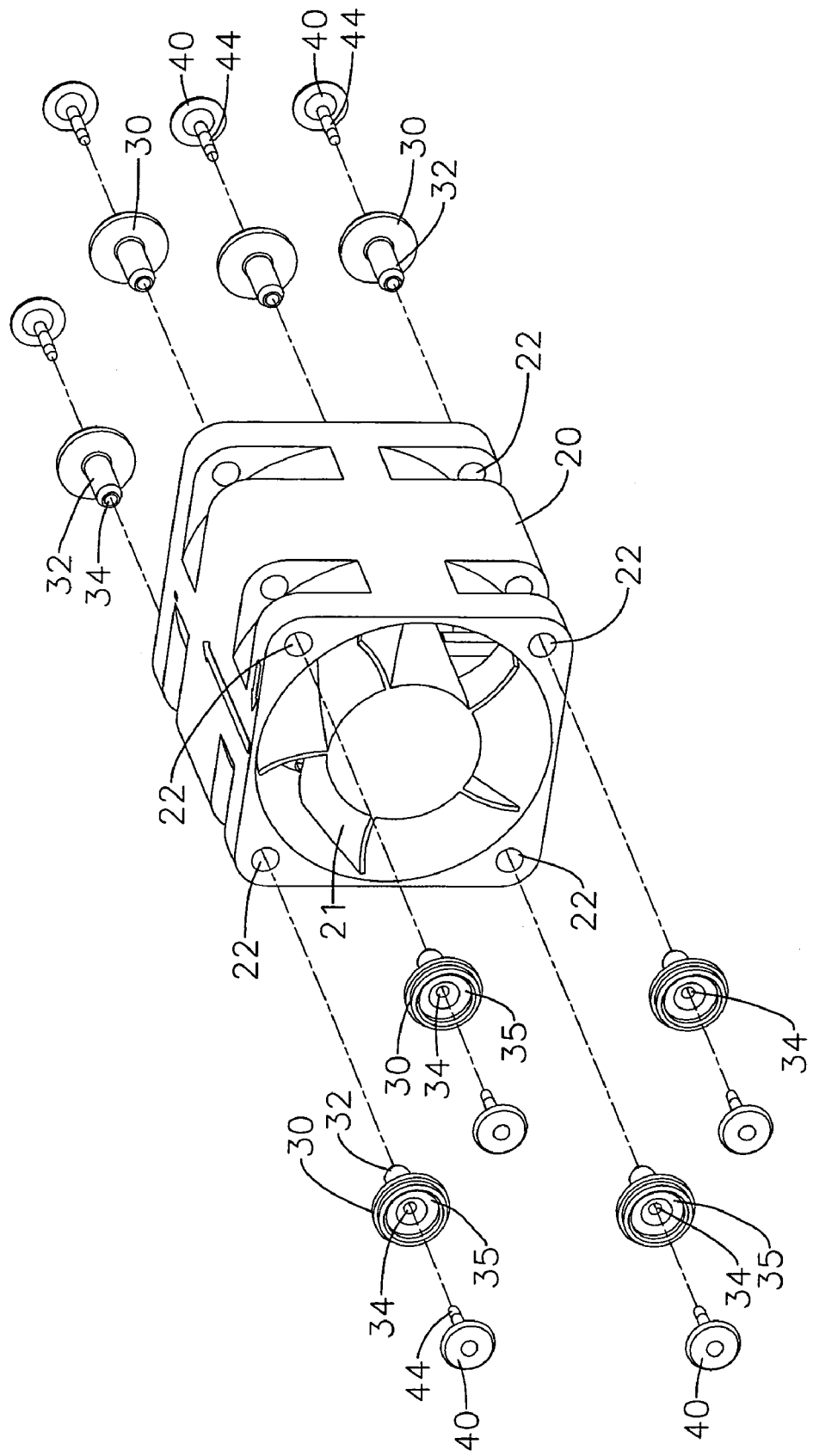
FIG. 2 shows a perspective view of a fan and vibration-proof elements of the present invention.
Figure 3:
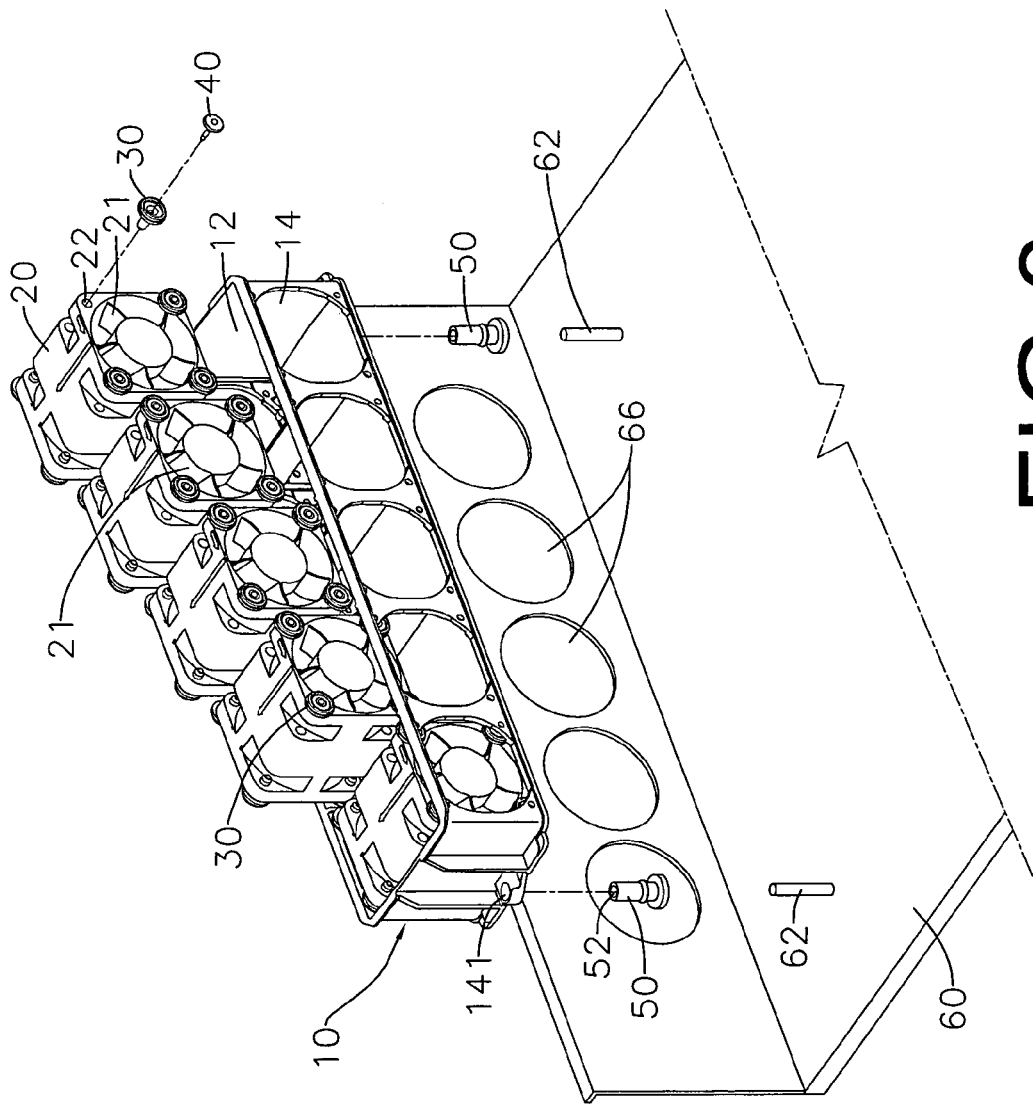
FIG. 3 shows a perspective view upon assembling fans of the present invention.

Referring to FIG. 1, FIG. 2, and FIG. 3, the present invention is to provide a fan device for a computer hose, which comprises a rectangular container 10 having an emplacement sink 12; at least more than one fan 20 whose front and rear surfaces are provided with a plurality of latch holes 22, respectively; a plurality of positioning outer jackets 30 which are made by a flexible material, and each of which is provided with a hollow pillar 32 in its interior end and an inward groove 35, which contains a deep positioning hole 34, on its exterior surface; and a plurality of positioning inner jackets 40 which are made by a hard material, and each of which is provided with an outer ring 42 on its exterior end and a pin 44 at its interior end. The pin 44 is inserted and tightly fitted into the positioning hole 34, the outer ring 42 is fitted into the groove 35, and the hollow pillar 32 is latched into the latch hole 22.

Figure 4:
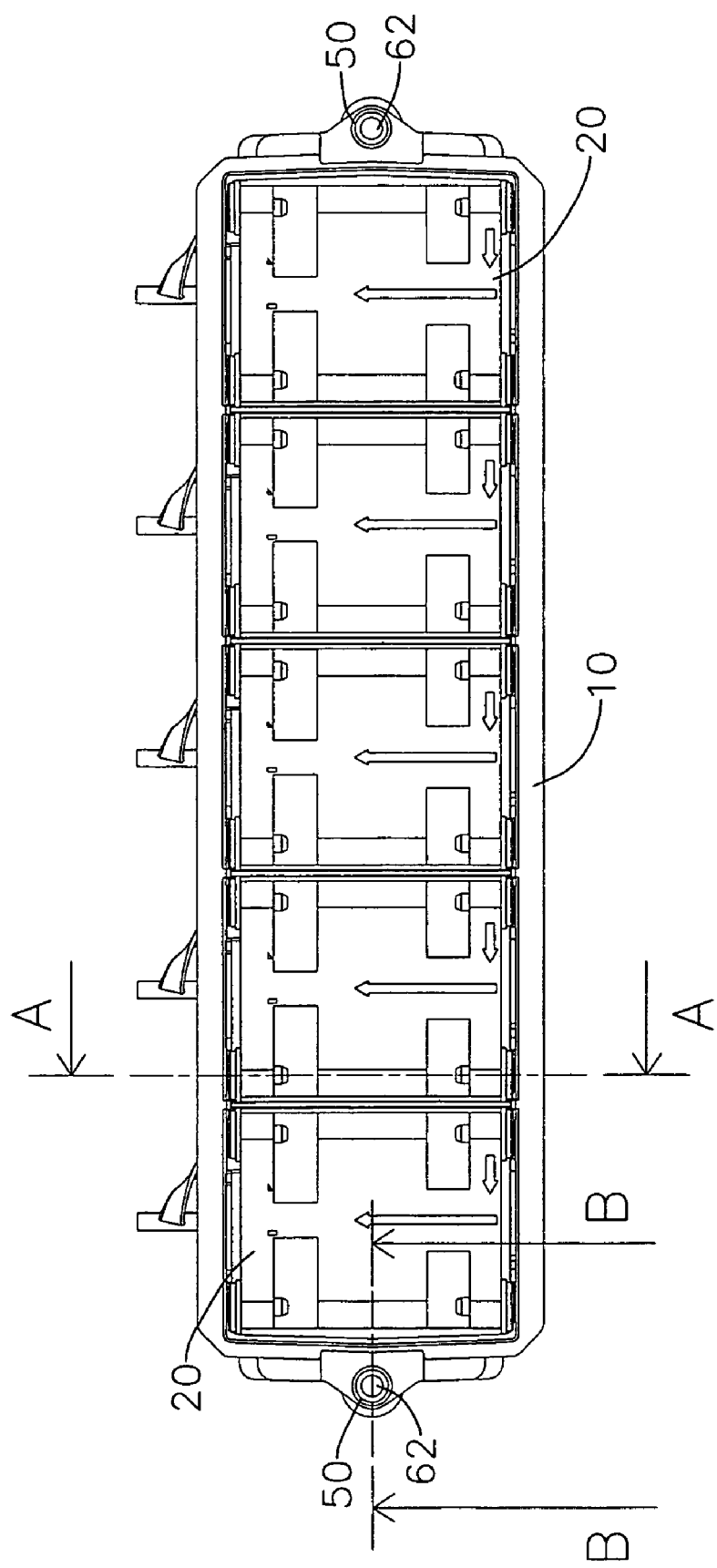
FIG. 4 shows a top view of the present invention.
Figure 5:
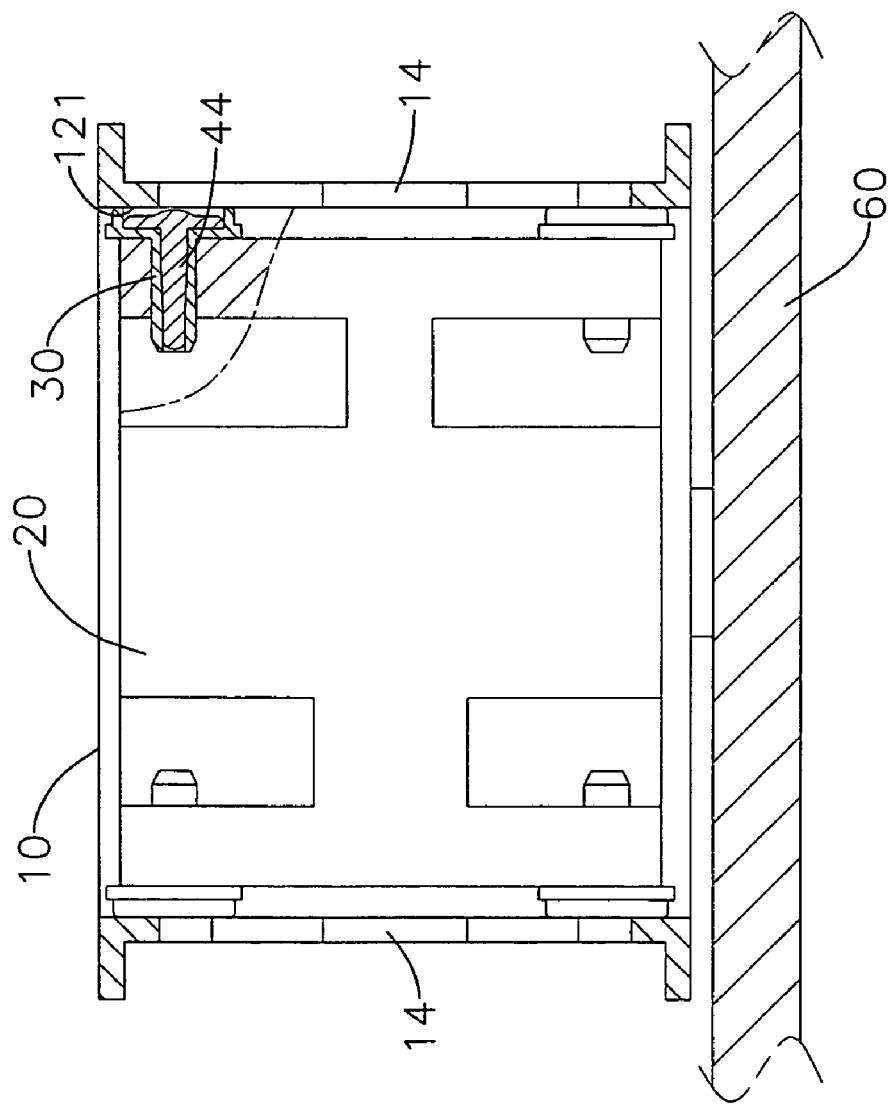
FIG. 5 shows a cutaway view along line A-A of FIG. 4.

An exterior surface of positioning outer jacket 30 is latched and positioned on an inner sink wall 121 of the emplacement sink 12 (as shown in FIG. 4 and FIG. 5).

Referring to FIG. 3, two side ends of the rectangular container 10 are provided with an insertion hole 141, respectively. A kit (the kit being a bushing) 50 made by a flexible material is provided with a through-hole 52 at its center, and can be inserted into the insertion hole 141.

Pillars 62 are installed on a bottom plate of a casing 60 of computer host and are inserted into the through-holes 52 for positioning. The rectangular container 10 is positioned on the pillars 62.

The kits 50 and the outer jackets 30 can all be made by a rubber material which can absorb vibration.

Two sides of the container 10 are provided with wind guiding holes 14, and leaves 21 of fan 20 are corresponding to the wind guiding holes 14.

A side board 65 of the casing 60 of computer host is provided with wind guiding holes 66 which are in connection with the wind guiding holes 14 of the container 10 (as shown in FIG. 3).

Figure 6:
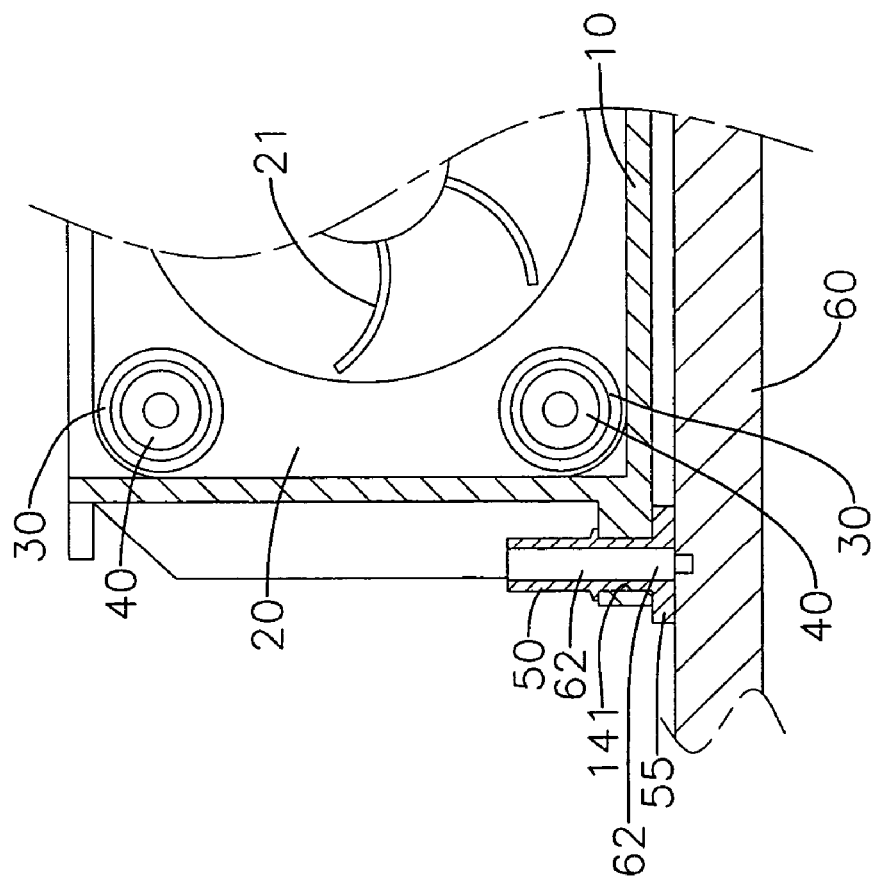
FIG. 6 shows a local cutaway view along line B-B of FIG. 4.

Referring to FIG. 2, two sides of a fan 80 are provided with eight positioning outer jackets 30 made by a rubber material. As shown in FIG. 4 and FIG. 5, when driving leaves 21 of a fan 20, a vibration force resulting from torsion will be transmitted to an inner sink wall 121 by the positioning outer jackets 30 and positioning inner jackets 40. During a process of transmitting the moment of vibration force, the vibration force can be greatly reduced due to that the positioning outer jackets 30 are made by the rubber material which is provided with an effect of absorbing vibration. Referring to FIG. 6, a kit 50 is a rubber material and thus is provided with an effect of absorbing vibration, such that when the vibration force is transmitted to the kit 50, it will be absorbed again. Accordingly, the torsion and moment of vibration force resulting from a rotation of the leaves 21 of fan 20 of the present invention, can be effectively absorbed, thereby achieving the effects of preventing from vibration and greatly reducing a noise. Referring to FIG. 6, insertion holes 141 at two sides of the container 10 are directly sheathed on the kits 50, and as a bottom of kit 50 is provided with a thickened cushion ring 55, a bottom surface of the container 10 will not touch the casing 60, thereby preventing the moment of vibration force being directly transmitted to the casing 60.

Referring to FIG. 3, FIG. 4, and FIG. 5, the fixing of the fan 20, container 10, and casing 60 of the present invention can all be performed without using screws; therefore, it is very convenient to proceed with the assembling and disassembling.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A fan device for a computer host comprising a rectangular container having an emplacement sink including an inner sink wall; a plurality of fans each of which have front and rear surfaces provided with a plurality of latch holes; and a plurality of positioning outer jackets made of rubber and capable of absorbing vibration, and each of the positioning outer jackets having a rear surface, a forwardly extending hollow pillar, an inward grove on the rear surface and a deep positioning hole extending into and through the hollow pillar and the hollow pillar inserted and latched into the latch hole, and a plurality of positioning inner jackets made by a hard material, and each of the positioning inner jackets including an outer ring fitted into the groove of the outer positioning jacket, and a pin inserted and tightly fitted into the positioning hole of the positioning outer jacket; and an exterior surface of the positioning outer jacket latched in the inner sink wall of the emplacement sink and wherein two sides of the rectangular container are provided with insertion holes and a bushing made of rubber and able to absorb vibration having a through hole in a center and being able to be inserted into the insertion hole and pillars installed on a bottom plate of the casing of the computer host and inserted into the through holes for positioning with the rectangular container being positioned on the pillars and wherein the two sides of container are provided with wind guiding holes being corresponding to leaves of the fans, whereas a side board of the casing of the computer host is provided with wind guiding holes for connecting with the wind guiding holes of the container.

* * * * *